United States Patent [19]
Palermo et al.

[11] 4,451,898
[45] May 29, 1984

[54] ASYNCHRONOUS INTERFACE MESSAGE TRANSMISSION USING SOURCE AND RECEIVE DEVICES

[75] Inventors: David W. Palermo; David W. Ricci, both of Los Altos, Calif.; Joe E. Marriott; Thomas J. Heger, both of Loveland, Colo.

[73] Assignee: Hewlett-Packard Company, Palo Alto, Calif.

[21] Appl. No.: 319,559

[22] Filed: Nov. 9, 1981

[51] Int. Cl.³ .............................................. G06F 3/04
[52] U.S. Cl. ...................................... 364/900; 370/90
[58] Field of Search ... 364/200 MS File, 900 MS File; 370/54, 90, 94; 340/825.05

[56] References Cited

U.S. PATENT DOCUMENTS

| | | | |
|---|---|---|---|
| 3,633,169 | 1/1972 | Bickford | 364/200 |
| 3,794,983 | 2/1974 | Sahin | 370/54 X |
| 3,879,710 | 4/1975 | Maxemchuk et al. | 364/200 |
| 4,051,328 | 9/1977 | Mattern | 370/90 |
| 4,103,288 | 7/1978 | Westman | 340/825.05 X |

Primary Examiner—Harvey E. Springborn
Attorney, Agent, or Firm—John A. Frazzini

[57] ABSTRACT

An asynchronous interface enables the transfer of information between a set of devices operating in a loop and having a wide range of operating speeds. Each device can enter a Controller active state in which it sources command frames to control the loop operation. Each device can also enter a Talker active state in which it sources Data frames on a Listener active state in which it received Data frames. The transfer of frames is coordinated by a set of handshakes which enable the frames to be transferred in an asynchronous manner.

33 Claims, 5 Drawing Figures

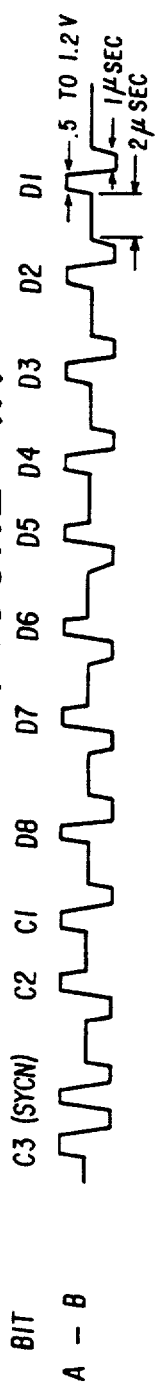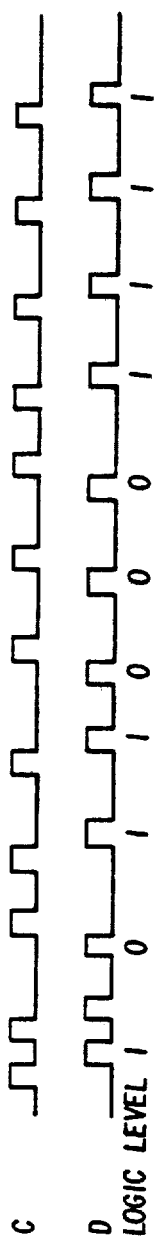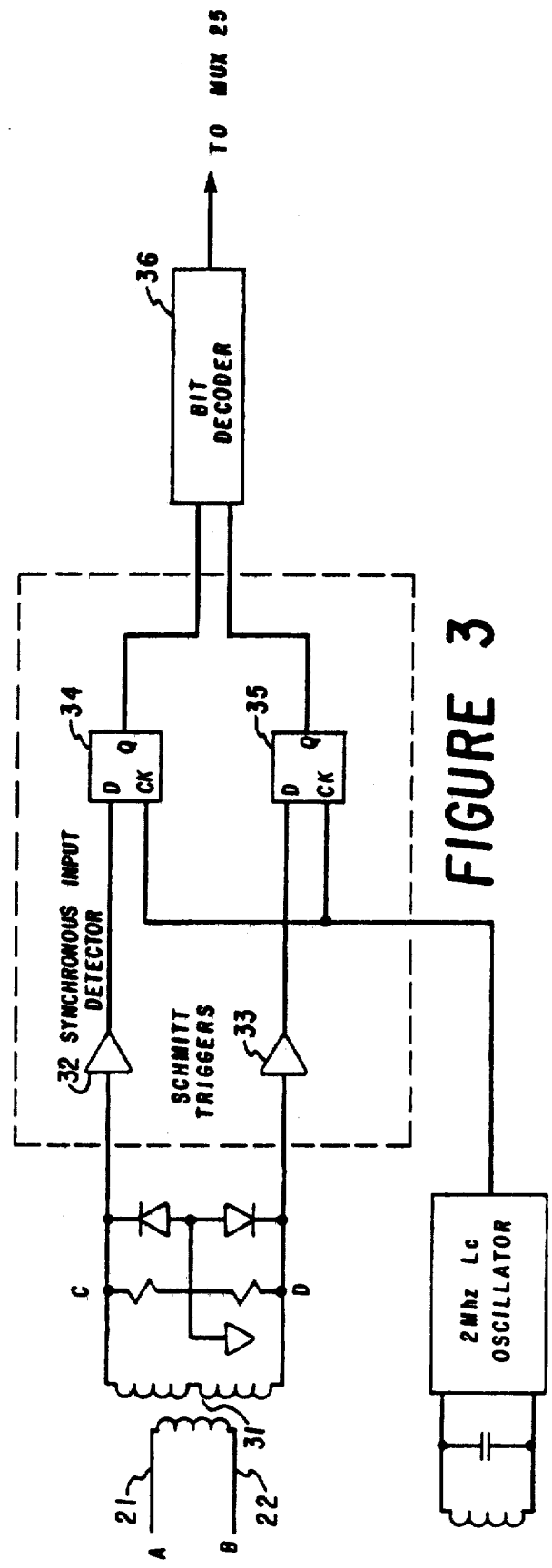

REGISTER 0 - STATUS REGISTER

| | BUS 7 | BUS 6 | BUS 5 | BUS 4 | BUS 3 | BUS 2 | BUS 1 | BUS 0 |
|---|---|---|---|---|---|---|---|---|
| READ | SC | CA | TA | LA | SSRQ | RFCR | CLIFCR | MCL |
| WRITE | SC | CA | TA | LA | SSRQ | SLRDY | CLIFCR | MCL |

SC - SYSTEM CONTROLLER  
CA - CONTROLLER ACTIVE  
TA - TALKER ACTIVE  
LA - LISTENER ACTIVE  
SSRQ - SEND SERVICE REQUEST  
RFCR - RFC MESSAGE RECEIVED  
MCL - CHIP MASTER CLEAR  
SLRDY - SET LOCAL READY  
CLIFCR - CLEAR IFCL BIT

REGISTER 1 - INTERRUPT REGISTER

| | BUS 7 | BUS 6 | BUS 5 | BUS 4 | BUS 3 | BUS 2 | BUS 1 | BUS 0 |
|---|---|---|---|---|---|---|---|---|
| READ | C3IN | C2IN | C1IN | IFCR | SRQR | FRAV | FRNS | ORAV |
| WRITE | C3OUT | C2OUT | C1OUT | INTERRUPT ENABLE BITS | | | | |

C3IN-C1IN - CONTROL BITS FROM RECEIVED FRAME  
C3OUT-C1OUT - CONTROL BITS FOR TRANSMITTED FRAME  
IFCR - IFC MESSAGE RECEIVED  
SRQR - SRQ MESSAGE RECEIVED  
FRAV - FRAME AVAILABLE  
FRNS - FRAME RECEIVED NOT AS SENT  
ORAV - OUTPUT REGISTER AVAILABLE

REGISTER 2 - DATA REGISTER

| | BUS 7 | BUS 6 | BUS 5 | BUS 4 | BUS 3 | BUS 2 | BUS 1 | BUS 0 |
|---|---|---|---|---|---|---|---|---|
| READ | D8IN | D7IN | D6IN | D5IN | D4IN | D3IN | D2IN | D1IN |
| WRITE | D8OUT | D7OUT | D6OUT | D5OUT | D4OUT | D3OUT | D2OUT | D1OUT |

D8IN-D1IN - DATA BITS FROM RECEIVED FRAME  
D8OUT-D1OUT - DATA BITS FOR TRANSMITTED FRAME

REGISTER 3 - PARALLEL POLL REGISTER

| | BUS 7 | BUS 6 | BUS 5 | BUS 4 | BUS 3 | BUS 2 | BUS 1 | BUS 0 |
|---|---|---|---|---|---|---|---|---|
| READ | ORE | RERR | PPST | PPEN | PPPOL | P3 | P2 | P1 |
| WRITE | — | — | PPST | PPEN | PPPOL | P3 | P2 | P1 |

ORE - OUTPUT REGISTER EMPTY  
PPST - PARALLEL POLL STATUS  
PPPOL - PARALLEL POLL POLARITY  
RERR - RECEIVER ERROR  
PPEN - PARALLEL POLL ENABLE  
P3-P1 - PARALLEL POLL BIT DESIGNATION

REGISTER 4 - LOOP ADDRESS REGISTER

| | BUS 7 | BUS 6 | BUS 5 | BUS 4 | BUS 3 | BUS 2 | BUS 1 | BUS 0 |
|---|---|---|---|---|---|---|---|---|
| READ/WRITE | SCRATCHPAD BITS | | | ADD 4 | ADD 3 | ADD 2 | ADD 1 | ADD 0 |

ADD4-ADD0 - DEVICE'S LOOP ADDRESS

REGISTER 5 - SCRATCHPAD REGISTER

| | |
|---|---|
| READ/WRITE | SCRATCHPAD BITS |

REGISTER 6 - SCRATCHPAD REGISTER

| | |
|---|---|
| READ/WRITE | SCRATCHPAD BITS |

REGISTER 7 - AUXILIARY INPUT REGISTER

| | BUS 7 | BUS 6 | BUS 5 | BUS 4 | BUS 3 | BUS 2 | BUS 1 | BUS 0 |
|---|---|---|---|---|---|---|---|---|
| READ | AUX7 | AUX6 | AUX5 | AUX4 | AUX3 | AUX2 | AUX1 | AUX0 |
| WRITE | — | — | — | — | — | — | — | OSCDIS |

OSCDIS - OSCILLATOR DISABLE  
AUX0-AUX7 - FLAG INPUT LINES

FIGURE 4

ASYNCHRONOUS INTERFACE MESSAGE TRANSMISSION USING SOURCE AND RECEIVE DEVICES

BACKGROUND OF THE INVENTION

This invention relates generally to interface methods and apparatus for transferring information between devices and more particularly to interface methods and apparatus for transferring information between devices coupled in a linear arrangement or in a loop structure. Because of the decreasing cost and increasing use of microprocessors, calculators and computers it is becoming increasingly attractive to combine at least one of these devices with a number of other devices such as test instruments to form a coordinated system in which the devices are coupled by suitable interface apparatus. The necessary structure of the interface apparatus is strongly dependent upon the class of devices which are to be coupled to form the system. In many systems and particularly in the early examples of systems, I/O signal parameters such as the protocol (i.e., rules governing timing and format of message exchanges) and voltages differed among devices in such systems so that an I/O circuit card was required for every interface between a pair of devices. To avoid this need for a multiplicity of I/O circuit cards a trend has developed to standardize input and output protocol and voltages. Such standardization enables system configuration to be changed simply by reconnecting cables, deleting devices and/or adding devices to the system. The elimination of the multiplicity of I/O circuit cards also reduces the cost of interconnecting devices to form a system.

Unfortunately, just as one set of voltages and protocol is not ideally suited to all devices, a single interface is not ideally suited to all systems. As a result of this, a number of interfaces have already been developed. A discussion of several interfaces is presented in chapters 9 and 12 of the text entitled "Computer Organization" written by Hamacher et al and published by McGraw-Hill in 1978. In general an interface should perform the following functions: (1) provide device status to assist information transfer; (2) provide a data buffer for temporarily storing input or output information; (3) recognize device addresses to enable transfer of information between a subset of devices in the system; and (4) provide timing and gating signals to control information transfer. In many interfaces separate lines are provided for transmitting data signals, address signals and control signals. The number of data lines employed by an interface is dictated largely by data transfer rate requirements. In a relatively slow interface such as that connecting a central processing unit to a teletypewriter, teleprinter, line printer or magnetic tape unit, bit-serial data transfer is adequate so that in addition to the reference voltage line only a single data line is required. In a byte-serial interface, such as the Hewlett-Packard Interface Bus, 8 data lines are required.

Interfaces can be broadly classified as being either synchronous or asynchronous. In a synchronous interface all timing information is derived from a single system clock which defines equally spaced intervals in each of which a single data transfer can take place. A major drawback to such an interface is that the clock rate must be no faster than the slowest device which might be coupled into the system thereby providing low speed data transfer even between high speed devices. Therefore, a number of asynchronous interfaces have been developed which do not restrict data transfer to equally spaced intervals. These interfaces are well suited for systems utilizing devices having a wide range of data processing speeds. In these interfaces the system clock is replaced by a set of timing control lines over which the devices signal one another when they have completed a step or are ready to begin the next step in the data transfer process.

Interfaces can also be broadly classified according to the physical pattern of interconnection between the devices. Some common configurations are: the star configuration in which all peripheral devices are connected to a single controller such as a calculator or computer; the multipoint configuration in which all devices are connected in parallel to a single interface bus; the tree configuration in which a set of linking devices are coupled in a star configuration to the controller and each linking device in turn has a set of peripheral devices coupled to it; and the loop configuration in which the output port of each device is connected to the input port of another device.

The Hewlett-Packard Interface Bus (HP-IB) is an example of a byte-serial asynchronous interface. This interface utilizes a protocol which has been adopted as IEEE Standard 488 (1975). In this interface the devices are connected in a multipoint configuration by a 16 wire bus. Eight of the sixteen wires are data lines enabling this interface to transmit data in the byte-serial format. The remaining lines are control lines used to regulate data transfer.

Devices coupled to the HP-IB can play one of 3 active roles: (1) Controller; (2) Talker; or (3) Listener. Unless a device is assigned an active role it remains inactive. At system configuration, one of the devices is designated, by means of switches on that device as the System Controller and issues commands to the other devices to regulate data transfer. One of the 8 control lines known as the Multiple Response Enable (MRE) line is utilized by the Controller to inform the other devices whether the signal on the data lines represents a command or represents data. When the Controller pulls the MRE line low to signal that a command is present on the data lines all of the other devices must listen to the data lines and only the Controller may transmit signals.

Each device contains switches which enable an address to be assigned to it at the time of system configuration. These addresses enable addressed commands to be placed on the data line for response only by the device having the corresponding address. A number of devices are designated as Listeners by issuing for each of these devices a Listen command having the address of that device. Data transfer is then initiated by issuing a Talk command having the address of the device which is to transmit data (i.e., to be the Talker). Transmission of data can be terminated by issuing an Untalk-command. All of the Listeners can be placed in an inactive state by issuing an Unlisten command.

The asynchronous transfer of data from the Talker to the Listener is controlled by the three control lines known as Ready for Data (RFD), Data Valid (DAV) and Data Accepted (DAC). When all of the Listeners are ready to accept data the RFD line goes high to inform the Talker that it can send data. The Talker then places data on the data lines and after a time sufficient to allow transients in the data to settle lets its DAV line go low to signal the Listeners to accept the data. The first Listener to respond begins accepting the data and pulls the RFD line low to indicate that the Listeners are busy accepting data. After all of the Listeners have accepted the data the DAC line goes high. The Talker then resets the DAV line high and removes the data from the data lines. This handshake is then completed when the Listeners reset the DAC line. This sequence is repeated until all of the data is transferred to the Listeners.

A number of additional addressed commands are also available to regulate data transfer. The Controller can pass control of the system to another device by one of such commands. However, to enable the system user to initiate or terminate an operation, one of the Controllers must be able to assume control of the bus without being addressed itself. This Controller, designated at the time of system configuration as the System Controller has sole control over a control line called End Output (EOP). When EOP goes low all devices other than the System Controller enter an inactive state.

The devices are connected in a logical-OR configuration to a control line known as the Service Request (SRQ) line to enable the devices to signal the Controller that they need attention. The Controller can determine which of the devices has requested service by either a serial poll or a parallel poll. In a serial poll the Controller executes a series of addressed serial poll commands which ask successive devices if they are the device requiring attention. These poll commands continue until the Controller locates the device requesting service. In a parallel poll, the Controller issues a single parallel poll command and each device which requires service responds by pulling low the data line to which it was assigned at the time of system configuration. Since more than one device can be assigned to a given data line, the parallel poll does not indicate which device or devices has requested service, but instead only indicates those groups of devices that include devices requesting service. The devices in these groups must then be polled serially to locate the device requesting service.

HP-IB is a fast general purpose interface suitable for coordinating data acquisition and analysis by a system of instruments but it is most appropriate for use in a spatially compact system which includes an expensive high speed Controller whose time should not be wasted. There are number of relatively low speed low cost battery powered calculators and peripherals now available for which such interface speed is not required. In addition the relatively high power requirements of HP-IB and high cost of multiwire interconnects is undesirable for use in connecting such devices.

A second interface of interest is the Pierce Loop, discussed at page 372 of the text entitled "Computer Organization" by Hamacher, et al. This interface is an example of a loop structured system. Each device in the loop can communicate with any other device in the loop. Data transmission around the loop occurs in equally spaced time frames. Any device seeking to transmit data can transmit in any frame which is empty so that this loop is the functional equivalent of a circular conveyor belt for conveying data. Because of the synchronous nature of transmission, the Pierce Loop is not well adapted for controlling data transmission between devices having a wide range of speeds.

Because of the trend to interface a number of devices to form a coordinated system, the recent development of inexpensive battery operated hand-held calculators has produced a need for an inexpensive, low-power, compact interface for use in systems under the control of such a calculator. The interface can be relatively low-speed because the operation of expensive devices will not be tied up by such low-speed interfacing, but the interface should be asynchronous to make it compatible with instruments of disparate speed. The interface should also enable enough exchange of commands that it is flexible enough to interface a full range of peripherals. The interface should minimize the number of I/O ports required on controllers because of the relatively small size of such calculators. The interface should also be easily useable by nontechnical consumers because this is a large part of the class of users interested in such low-cost devices.

SUMMARY OF THE INVENTION

In accordance with the illustrated preferred embodiment, an asynchronous bit-serial interface is presented that utilizes a 2-wire loop configuration. An object of the invention is to provide an inexpensive, compact interface suitable for connecting a set of inexpensive, possibly battery powered devices to produce a coordinated system. Each device to be incorporated into the system contains one of these interfaces. Each interface includes a central processing unit (CPU) to control the interface operations and includes a 2-wire input terminal and a 2-wire output terminal. Each device in the loop has its output terminal connected to the input terminal of a succeeding device in the loop so that signals travel in only one direction around the loop.

The 2-wire loop configuration is particularly suitable for linking small inexpensive devices because the interface in each device only requires a 2-wire input terminal and a 2-wire output terminal regardless of the number of devices connected to form the system. This enables the incorporation of such an interface in small devices (e.g., handheld calculators) having a limited amount of surface area available for interface terminals. The 2-wire aspect also reduces the power requirements below that in a multiwire interface by only requiring power for a single 2-wire output driver. The loop configuration reduces power requirements because each driver only provides a signal to the next device in the loop rather than to a plurality of devices as in a multipoint interface like HP-IB. The 2-wire aspect also reduces the cost of cables to interconnect the devices in the loop thereby enhancing the utility of such an interface in an inexpensive system. Because such inexpensive systems typically include relatively low speed devices, the reduction in data transmission speed from that in a multiwire interface is not a serious limitation and is outweighed by the cost and power advantages.

The asynchronous nature of the interface provides the flexibility needed to efficiently interface between devices having a wide range of processing speeds. The asynchronous transmission is accomplished by a set of handshakes which depend on the type of information being transferred and on the states of the devices in the loop. The handshakes enable the Source of information to determine when the devices receiving such information are ready to accept further information.

Although information is transferred in bit-serial format, the bits are grouped into 11 bit message units called frames. The beginning of each frame is indicated by a special synchronization signal which not only transmits the binary information contained in the first bit of the frame but in addition indicates that that bit is the first bit of a frame. Each frame consists of 8 data bits preceded by 3 control bits which indicate how to interpret the data bits. The 8 classes of frames definable by the 3 control bits represent 5 different kinds of frames: (1) a Data frame used to transfer data; (2) an End frame which is a data frame that additionally indicates the end of a data file (i.e., when the data transferred by an End frame is stored, an indication is also stored at that point to indicate that the associated piece of data is the last piece of information in a data file); (3) a Command frame to control system operation; (4) a Ready frame for use in establishing interface handshakes; and (5) an Identify frame for use in checking loop integrity or the need for service by a device in the loop.

In Data frames the data bits represent the data being transferred between devices. In Command frames the data bits determine the command involved and divide these frames into 5 classes of commands: (1) Universal commands to which all devices respond; (2) Talker address commands to designate which device is to be the Source of data (i.e., the Talker); (3) Listener address commands to indicate which devices are to receive the data transmitted by the Talker (i.e., the Listeners); (4) Addressed commands to which only the Talker and Listeners can respond; and (5) Secondary Addresses to designate functional components of a device having a Primary Address (e.g., to select particular components within a mainframe where the mainframe itself is assigned to primary address). In Ready frames the data bits determine the type of handshake information being transferred and divide the Ready frames into the following 3 groups: (1) the Ready for Command (RFC) frame employed in the handshake used for transmission of commands; (2) the Auto-Address group for use in assigning addresses to devices; and (3) the remaining Ready commands which are collectively called the Addressed Ready group. In an Identify frame the data bits are used to perform a parallel poll of the devices to see if any devices need service.

At any given time during information transfer around the loop, one of the devices functions as a Source of frames and the remaining devices function as Receivers. Any device that acts as a Source of Command frames is called a Controller because system operation is controlled by means of commands. In general a system can include more than one device capable of being the Controller, but at the time of system configuration the user must designate (e.g., by means of switches on these devices) which one is the System Controller. At system turn-on the System Controller is the Source of all frames and controls loop operation. By means of commands, loop control can be passed to any of the other potential Controllers but only the System Controller can unilaterally retake control of the system—all other potential Controllers can only have control passed to them by the active Controller.

At system configuration, addresses are assigned to the system devices to enable selective control of these devices. Each device has a register or switches which can be set manually to assign the address for that device. Alternatively the addresses can be set by use of the Auto-Address group of Ready frames. In this latter procedure the Controller transmits an Auto-Address frame containing the address 1. The first device (i.e., the device connected to the Controller's output terminal) interface sets an internal address register to 1, increments the address portion of the Auto-Address frame by 1 and then transmits this frame to the next device. As the Auto-Address frame passes around the loop, each device interface sets its address register to the address in that frame, increments the address portion of the frame by 1 and then retransmits the frame to the next device in the loop. By this process, the devices are assigned consecutive addresses. Once the addresses have been set, addressed commands can be used to selectively control the devices in the loop and to transfer the ability to source frames for transfer to the other devices.

The transmission of frames around the loop and the transfer of Source capability are regulated in accordance with a set of handshakes. The particular handshake employed depends on the type of frames being transferred and on the states of the devices in the loop. When a frame reaches an interface, the interface first decodes the control bits of the frame to determine the type of frame being transferred. For Data frames the interface utilizes a Hold Until Ready handshake. When a Data frame is transferred around the loop, each Receiver interface holds the frame until it is ready for another frame—that is, the interface retransmits the frame only when processing by the Receiver is complete. Therefore when a Data frame traverses the loop and returns to the Source, the Source knows that all devices in the loop are ready for the next Data frame. The Source therefore transmits a Data frame only when the previously transmitted Data frame returns to the Source completing the handshake. This handshake ensures that the Source transmits Data frames no faster than the Receivers in the loop can process them. This handshake also enables a simple transmission error checking procedure to be implemented. The Source retains a copy of the transmitted frame until that frame returns. If the frame as it returns differs from its copy then the Source interface sets a flag indicating that a transmission error has occurred. At the end of data transmission, the Controller is informed that an error occurred during transmission. This error checking procedure is applied in general and not just for Data frames so that any Source of a frame retains a temporary copy which is compared with the frame as it returns.

The Hold Until Ready handshake has the disadvantage that the Listeners process these frames in series. Since Command frames are typically of interest to several or all of the loop devices, a different handshake is required for transfer of Commands to enable commands to be processed essentially in parallel, otherwise the presence of several slow devices in a loop will significantly degrade the speed of response of the loop devices to Controller commands. Commands are therefore transferred by an Expedite handshake in which the command is promptly retransmitted by each Receiver interface upon determination that it is a Command frame and a copy of this frame is retained in each interface (such a handshake should be appropriate for any transfer of information which is generally of use with several of the devices on the loop). This handshake therefore rapidly transfers these frames around the loop, but the return of such a frame to the Source (i.e., the Controller) no longer indicates that all of the other devices are ready for the next frame. Therefore the Controller upon the return of a Command frame promptly transmits the Ready frame known as the Ready For Command (RFC) frame. The RFC frame passes around the loop via the Hold Until Ready handshake so that its arrival back at the Controller signifies that all of the devices in the loop are ready to receive and process further frames.

Typically, in the transfer of Data frames it is desired to transmit the data from a single data Source called the Talker to only one or a few of the Receivers known as Listeners. To avoid degrading the speed of data transfer due to the non-Listener Receivers, it is advantageous to design the interfaces to enable prompt retransmission of Data frames by non-Listener Receivers. Therefore, each interface includes a set of Status flags which indicate whether or not each device is Controller active, Talker active, and/or Listener active. In general a device cannot be both a Talker and a Listener but it can be both Controller and Talker active or Controller and Listener active.

When the Controller is also the Talker, then the initiation of data transfer requires only that the Listeners be designated before Data frames are sourced by the Talker. To select the Listeners, the Controller first transmits a Universal Command frame called the Unlisten Command to set each of the Receivers into a listener inactive state in which input Data frames are immediately retransmitted without interaction by the CPU of that interface. The Controller then transmits a set of Listener Address command frames, each having the address of a device that is to become a Listener. Those devices corresponding to one of the Listener Addresses enter a listener active state in which input Data frames are transferred to the interface CPU. Each Listener retransmits the Data frame only when its CPU is ready for another Data frame. The coding scheme for frames enables each interface to determine whether the input frame is a Data (or End) frame after decoding only one bit of the frame so that transmission delays due to non-Listeners are minimized.

When a device other than the Controller is to be the Talker, the Data transmission process involves a temporary transfer of the ability to source frames. To accomplish this transfer the Controller transmits a Talker Address command having the address of the device selected to be the Talker. That device responds by entering a Talker active state and retransmitting the Talker address frame to pass that frame around the loop to the Controller thereby informing the Controller that the Talker Address frame has reached all of the Receivers. The Controller then sends a Send Data command to tell the Talker to begin transmission. The Talker responds by sending its first Data frame rather than retransmitting the Send Data Command. Successive pieces of Data are then transferred via the Hold Until Ready handshake.

When transmission of Data frames is complete the Talker transfers the ability to source frames back to the Controller by sending a Universal Command called End of Transmission and then entering a Talker inactive state. When this command reaches the Controller, the Controller does not retransmit the frame but instead resumes control of the loop as the active source of frames. If the Talker had detected an error in data transmission during that data transfer, it would send a modified End of Transmission command that informs the Controller of such error as well as transferring the ability to source frames.

In a similar manner, the active Controller can transfer loop control to another Controller by sending a Controller Address command having the same address as the device that is to take over loop control. The Transferor Controller then enters a controller inactive state. On receipt of the Controller Address command the transferee Controller enters the Controller active state and does not retransmit that command.

The Controller can interrupt data transmission by use of a Ready frame called Not Ready For Data (NRD). To interrupt data transmission, the Controller, upon reception of a data frame, temporarily stores that frame and in its place transmits the NRD frame. The NRD frame is passed around the loop to the Talker which recognizes that it is to cease transmission. The NRD frame then passes around the loop from the Talker to the Controller which responds by transmitting the Data frame that it has temporarily stored in order to allow all Listeners between the Controller and the Talker to receive this Data frame. When this Data frame reaches the Talker, the Talker sends an End of Transmission message to the Controller to complete this handshake by informing the Controller that it is to resume control of the loop.

The System Controller can also interrupt data transmission by use of a particular universal command called Interface Clear (IFC). This command actually has greater utility than just interrupting data transmission—it can be used by the System Controller at any time to retake system control even when another device is acting as the Controller. The System Controller can transmit this command at any time and need not wait to receive an input frame before transmitting it. Therefore, unlike in the typical case where at most one frame is on the loop at any given time, the IFC command can be on the loop concurrently with another frame. In response to the IFC frame the Talker ceases transmission and the active Controller passes control to the System Controller.

The Controller can source another frame known as the Identify (IDY) frame at any time so that it too can be on the loop concurrently with another frame. One function of this frame is to test for breaks in the loop and therefore no response is required by any of the Receivers other than to promptly retransmit this frame. This handshake is similar to the Expedite handshake for commands in that the IDY frame rapidly traverses the loop but it differs from that handshake in that no copy of this frame is retained by any of the Receivers and no associated Ready signal need be sent to determine when the Receivers are ready for another frame.

The IDY frame is also used to perform a parallel poll of the Receivers to see if any require service. The eight data bits of the IDY frame provide 8 positions in which the Receiver can signal that it requires service. By use of a set of Addressed Commands, the Controller can assign to each data bit of the IDY frame one or more associated Receivers. Each Receiver can then signal the Controller of its need for service by setting its associated bit in the IDY frame before ordering transmission of the IDY frame to the next device in the loop. Generally, eight or fewer Receivers will be associated with these data bits so that each of these Receivers can be exclusively assigned to one of these data bits. In such a case, when the Controller error checks the IDY frame upon its return to the Controller, the Controller can uniquely determine which devices need service. On the other hand, if some of the IDY data bits have more than one associated Receiver then this parallel poll merely indicates subsets of the Receivers that include at least one Receiver requiring service. To then determine which receivers actually require service, the Controller employs addressed commands to serially poll each Receiver in these subsets asking each if it required service. The Data, End and IDY frames also include a single control bit which can be set to indicate the need for service. In the case of Data or End frames the Controller would then have to serially poll all of the loop devices to determine which of them requested service. In this serial poll the Controller sequentially sends an addressed command to each device being polled and in response the device being polled modifies this command frame before retransmission if it needs service or else retransmits this command unmodified if it doesn't need service. In the case of IDY frames, only those Receivers not assigned to one of the IDY data bits will be associated with this control bit so that the serial poll need only be executed on this residuary set of Receivers.

To enhance the friendliness of a system employing this loop interface, each interface includes the ability to identify the model number of the device in which it is incorporated and also the functional capabilities of that device (e.g., printer, voltmeter, etc.). Therefore, after physically connecting the loop, the user need not explicitly inform the Controller of the character of each device to enable the Controller to know which Receiver to activate for specific tasks. For example, if the system user wants to have the output from a voltmeter plotted on a graph, the user can simply command the Controller to have a "Voltmeter" act as the Talker and have a "plotter" act as a Listener. The user need not then inform the Controller of the address of either the voltmeter or plotter—instead the Controller serially polls the devices on the loop asking if each is a voltmeter and when it locates one it ends that poll and commands that device to become the Talker. The Controller similarly locates the first plotter on the loop downstream from the plotter and commands it to become the Listener.

Because any instrument can malfunction it is sometimes necessary in a loop configuration to remove a malfunctioning device from the loop to avoid interfering with loop performance. However, physically removing the device might be inconvenient and also could interfere with loop operation while disconnecting the device from the loop. Therefore each interface can be placed into a Retransmit-All state in which that interface functions simply as a repeater, thereby retransmitting all signals with minimal delay.

Each interface also includes a Power Down (PD) state for conserving power. This state is beneficial in battery operated devices to conserve power during periods of loop inactivity. In this state the interface turns off all device functions other than an interface function of monitoring its input for incoming signals. Thus, the Controller can be programmed to send a power down command to the Receivers during periods of inactivity. Then the Controller can reactivate the devices on the loop at a subsequent period for loop activity by sending any frame (e.g., the IDY frame) around the loop.

DESCRIPTION OF THE FIGURES

FIG. 1A shows a typical signal transmitted between devices in the loop.

FIG. 1B shows the response at points C and D in FIG. 3 to the signal in FIG. 1 being applied across points A and B in FIG. 3.

FIG. 3 shows synchronous input dector 23 in greater detail.

FIG. 4 presents the registers shown in the block diagram in FIG. 2.

DESCRIPTION OF THE PREFERRED EMBODIMENT

Figure 2:
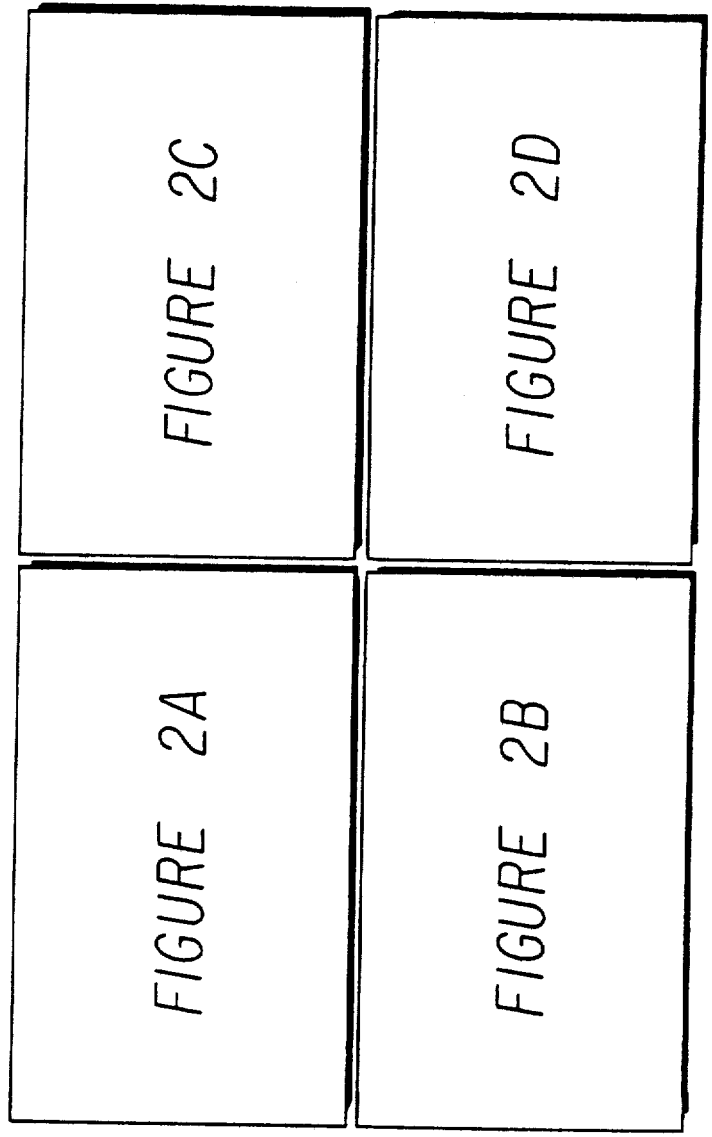
FIG. 2 is a block diagram of the preferred embodiment of the interface chip.
Figure 2A:
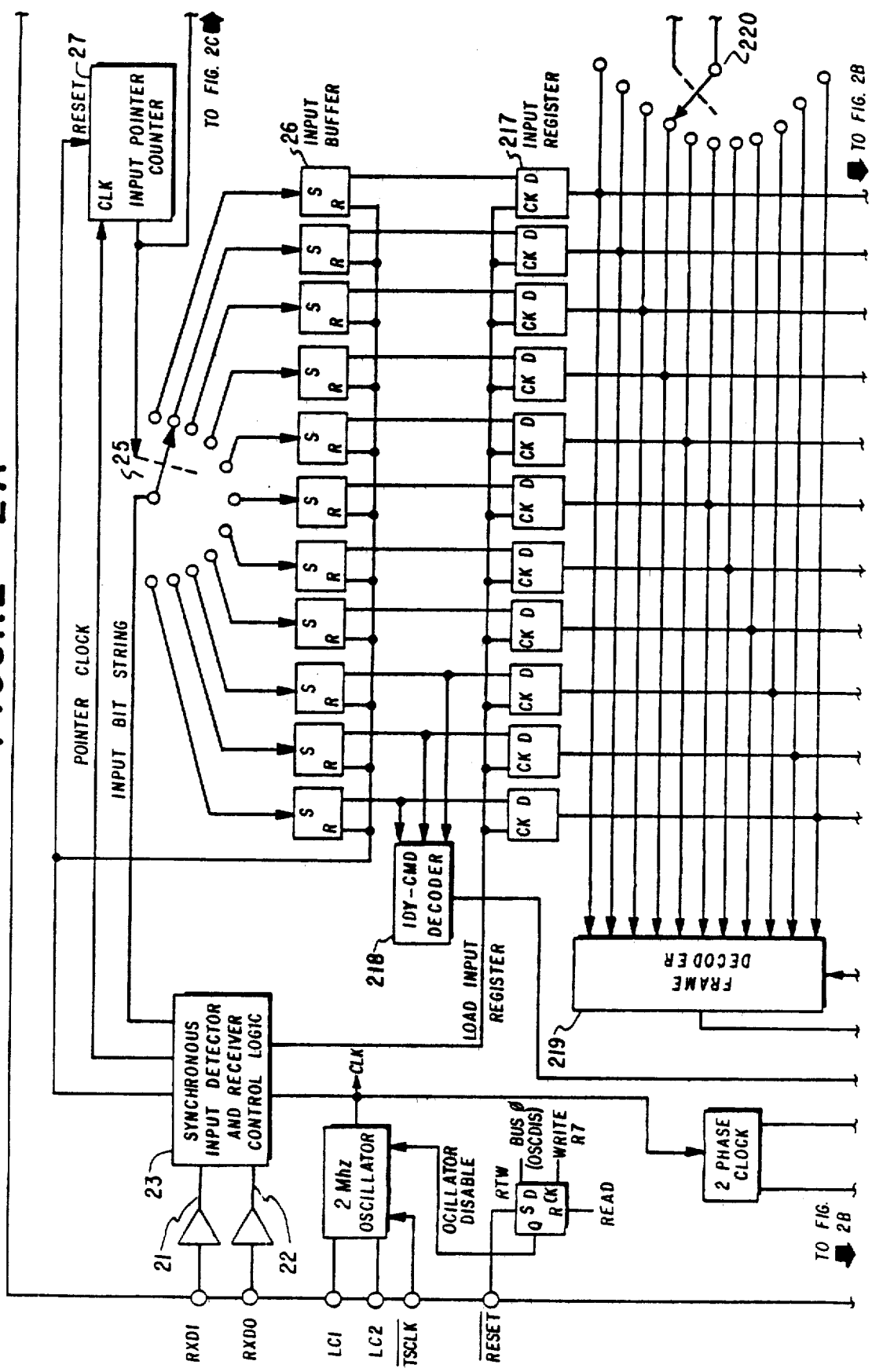
Figure 2B:
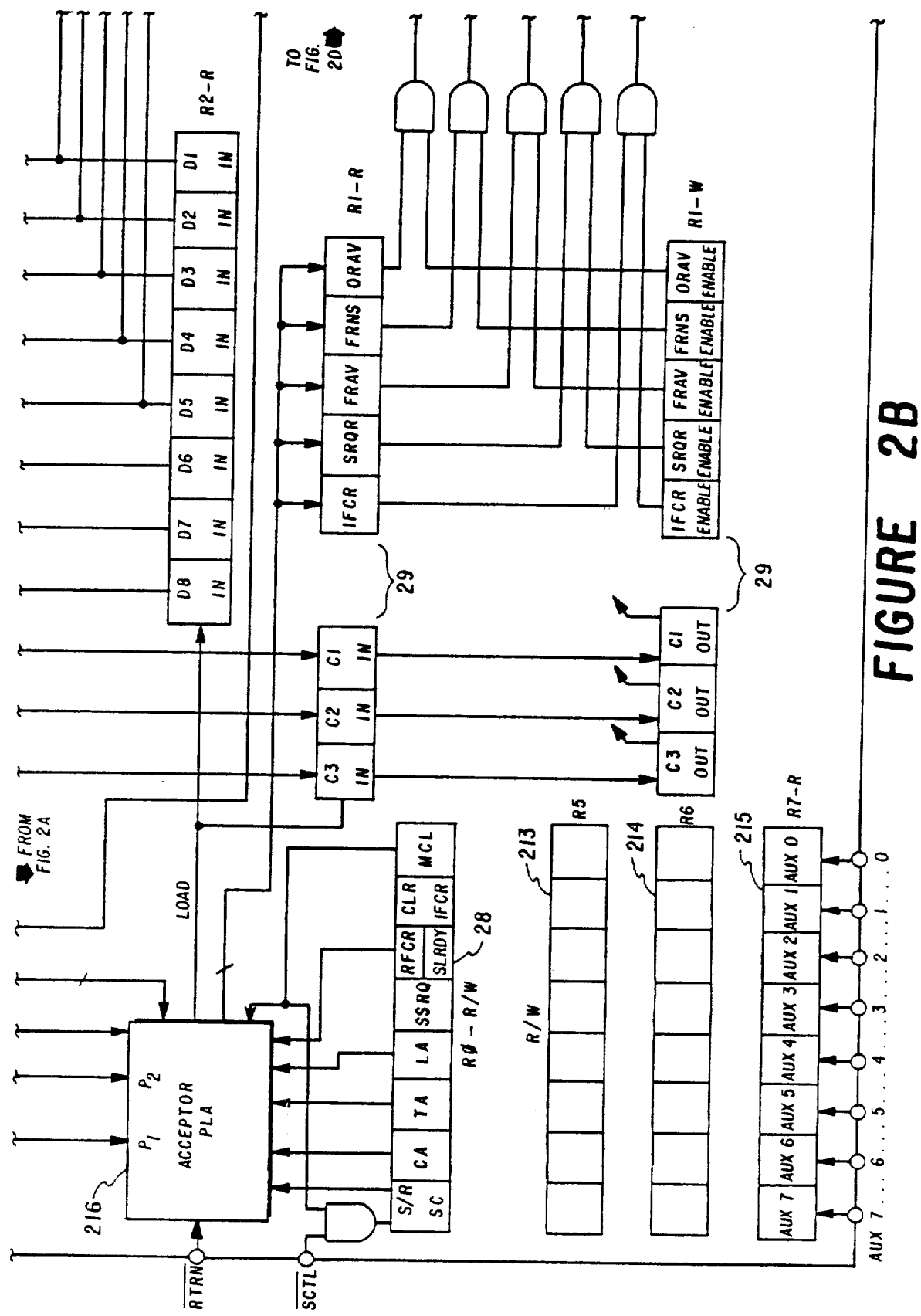
Figure 2C:
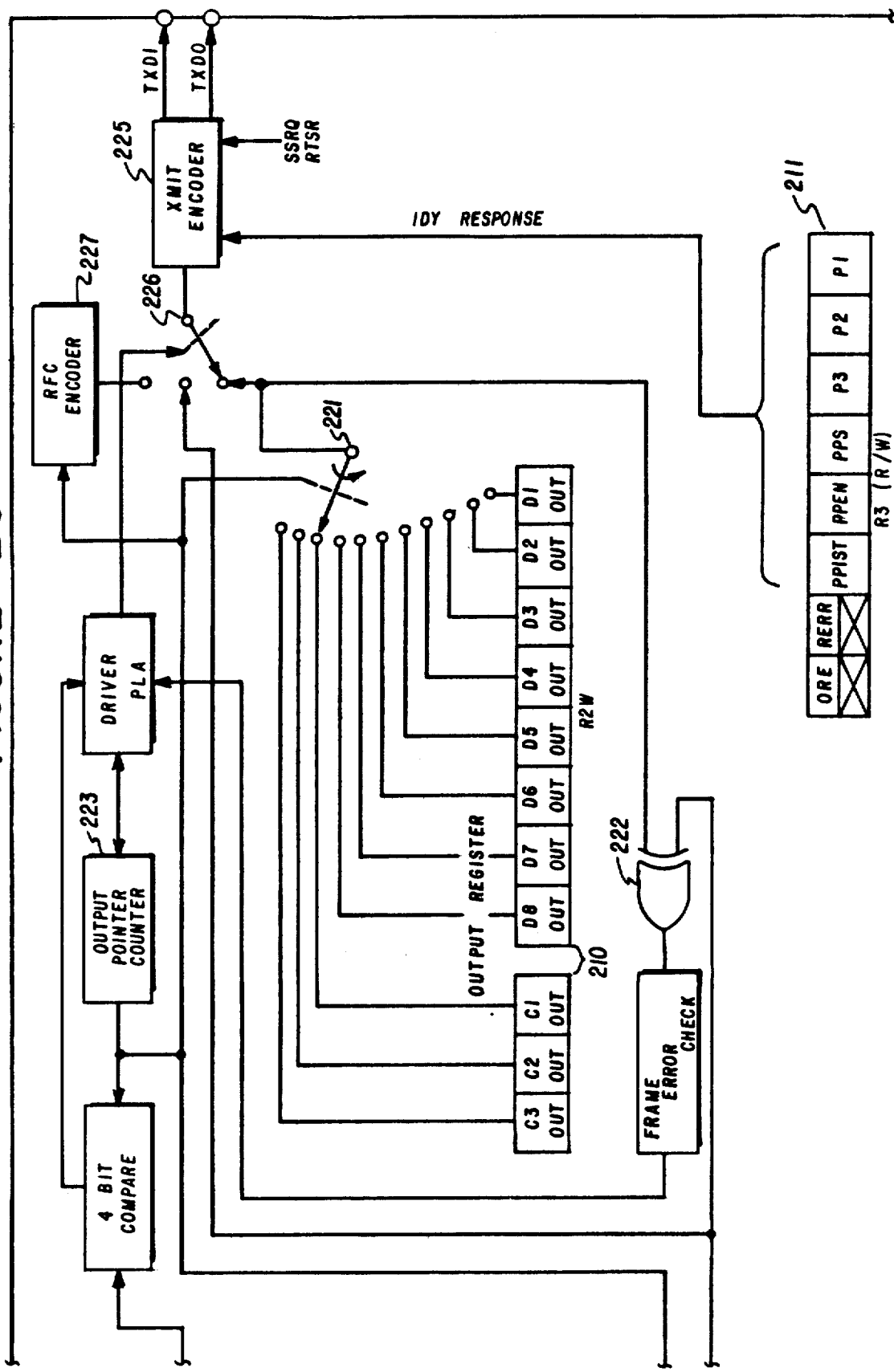
Figure 2D:
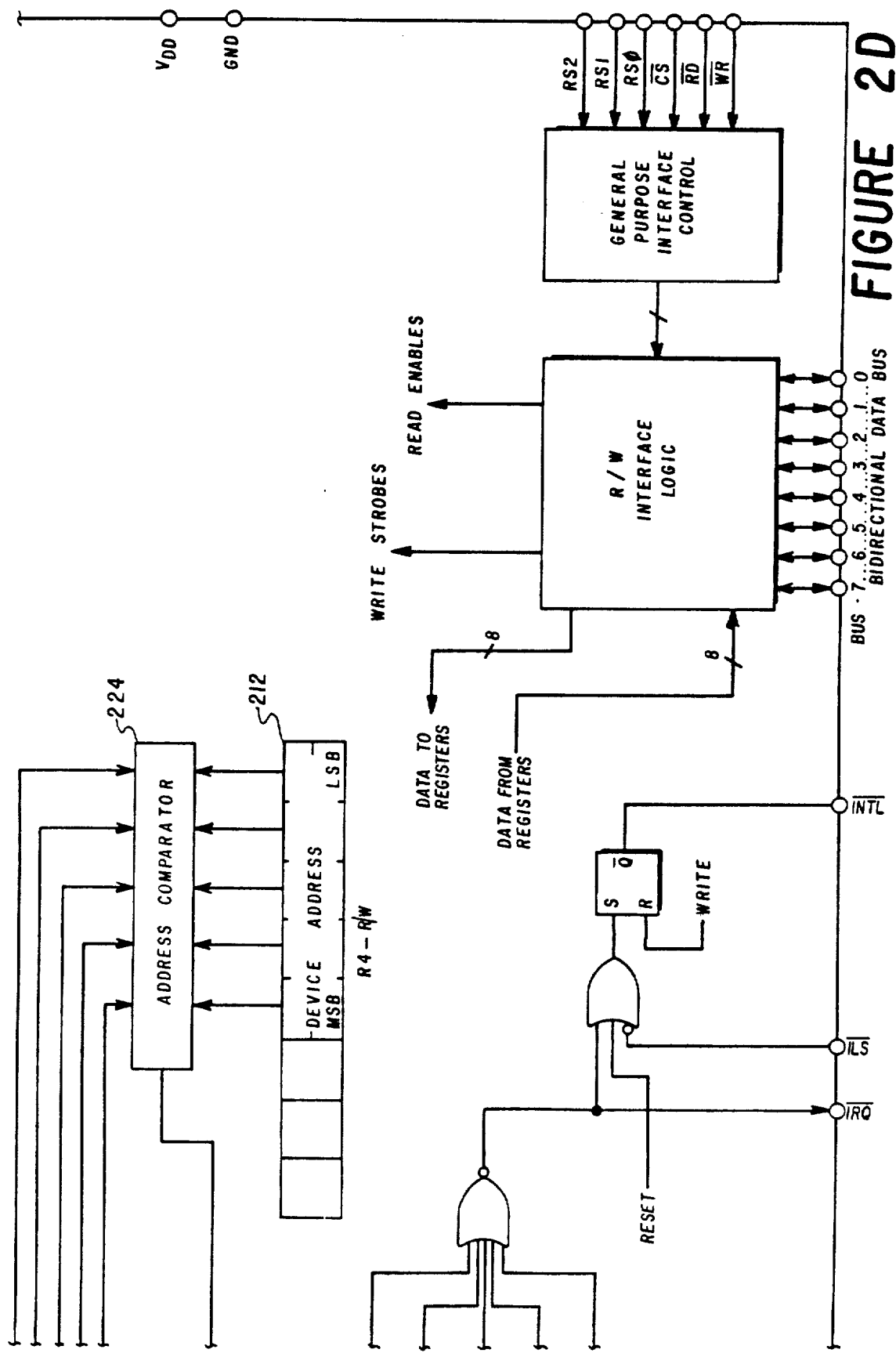

In accordance with the preferred embodiment of the disclosed interface system, a number of devices are connected in a 2-wire loop configuration to enable cooperative interaction among the devices. Each device in the system has a 2-wire output port connected to a 2-wire input port of another device in the system. The input and output port of each device are connected to an interface chip which performs some of the decoding and processing of the information signals between the devices. Each interface chip is coupled to a central processing unit (CPU) which complements the interface chip in the processing of information signals. Each CPU is in turn connected to the electronics of the device in order to enable the device to respond to information signals. The use of a CPU in the interface increases the flexibility of the interface by enabling the response of an interface to be varied by varying the programs within the CPU.

The electrical connection from one device to the next is a differential, voltage mode, 2-wire balanced line. The electrical connection is coupled to the interface chip at each end by means of transformer coupling. This allows both wires to float with respect to both devices' ground connections so that no common ground is required for all devices in the circuit. This is especially handy for voltmeters which need to measure values not referenced to ground. One of the wires is chosen as a reference and the voltage of the other wire is measured only relative to this reference. This structure has the advantage of avoiding ground loops which can form a substantial source of noise. Since most noise pulses tend to affect both wires equally, this system of connection is relatively noise free. Similarly, because during signal transmission, the voltage on one wire rises when the other falls, the amount of noise due to radiation from the system itself is reduced.

The signal bits are encoded using a 3 level code as shown in FIG. 1. The nominal value of the voltage difference for these three levels is 1.5 volts (high), 0 volts, and −1.5 volts (low). Every message on the loop is sent as a sequence of eleven bits called a message frame. The first bit in each frame is called the sync bit and is coded in a special way to signal the beginning of a message frame in addition to indicating the binary value of that bit.

The first three bits in each frame are called the control bits and determine the type of message frame being transmitted. Four types of frames are defined by the control bit patterns shown:

TABLE I

|  | C3 | C2 | C1 |
|---|---|---|---|
| Data or End (DOE) | 0 | END | SRQ |
| Command (CMD) | 1 | 0 | 0 |
| Ready (RDY) | 1 | 0 | 1 |
| Identify (IDY) | 1 | 1 | SRQ |

In Table 1, Data frames are the device dependent messages which transfer information from one device to another. End frames are Data frames which additionally indicate the end of a data record. For example, if in a given transmission, several data files are transferred from a floppy disk, then the End frame can be used to delimit each file during the transmission. The Data and End messages are processed in the same way and therefore will be referred to collectively as Data or End (DOE) frames. Command frames are used to configure the loop to control the transfer of DOE frames. Ready frames are used to establish addresses for the devices and to pass the ability to source frames from one device to another. Identify frames are special purpose frames which are used to test loop integrity (i.e., whether the loop is unbroken) and to execute a parallel poll to see if devices on the loop require service. In DOE and IDY frames, control bit C1 is not needed to designate frame type and so it is used as an alternative way for devices on the loop to signify that they need service. This bit is normally zero in DOE and IDY frames, so that if a device needing service receives one of these frames, that device sets control bit C1 to one when it retransmits the frame to pass the frame along around the loop.

The reception and transmission of message frames by the interface can be understood by reference to the block diagram of the interface chip shown in FIG. 2. An input message is supplied to the interface chip on receiver lines 21 and 22 at the input port of the device. These lines provide the input message to an input detector 23 shown in greater detail in FIG. 3.

As shown in FIG. 3, receiver lines 21 and 22 are coupled to detector 23 by a transformer 31 in which the ratio of windings is chosen to convert from the 1.5 volt amplitude of the signals on the connecting pairs of wires to the binary logic voltage level of the interface chip. The voltage difference between lines 21 and 22 for a typical input signal is shown in FIG. 1A. The resulting signals at points C and D are shown in FIG. 1B. These signals are non-negative and are logic level. Detector 23 uses a pair of Schmidt triggers 32 and 33 followed by a pair of D type flip-flops 34 and 35 clocked at 2 Mhz to detect the signals at points C and D. Bit decoder 36 monitors the flip-flop output to determine the logic level of each bit. The order in which the outputs of flip-flops 34 and 35 go high determines the binary data being transferred. For sync bits the pattern of highs CDCD indicates a logic 1 whereas the pattern DCDC indicates a logic 0. For non-sync bits the pattern CD indicates a logic 1 and the pattern DC indicates a logic 0. Bit decoder 36 provides output signals from detector 23 for transfer of the decoded input message frames.

The response of an interface chip and associated CPU to an input message frame is controlled by the programming of the CPU and by the content of a set of 8 bit registers R0–R7. These registers are shown throughout FIG. 2 as registers 28–215 and are also shown for convenience in FIG. 4. In several of these registers, different bits are accessed by the CPU in a read operation than are accessed by the CPU in a write operation. For example in register R0 (the Status register), the bit RFCR is accessed in a read operation by the CPU on bus 2 to register R0, whereas bit SLRDY is accessed in a write operation by the CPU on bus 2 to register R0. To indicate this register split, the read portion of a register will be designated by an R (e.g., R0R for register R0), the write portion will be designated by a W (e.g., R0W), whereas the entire register will be designated without an R or W (e.g., R0).

Register R0 is called the status register and contains bits which affect the response of an interface to an incoming signal. Bit SC (System Controller) is set at system configuration only in the device which is to function as the System Controller. This bit will typically be set in response to a switch on the console of the device selected as the System Controller. Bit CA (Controller Active) is set in the device which serves as the active loop Controller. When control is passed from the active Controller to another Controller, the previously active Controller resets this bit in its interface chip and the newly active Controller sets this bit in its interface chip. During a period of Data transmission, the bit TA (Talker Active) is set in the device that serves as the Talker and bit LA (Listener Active) is set in those devices that serve as Listeners. Bit SSRQ (Send Service Request) is set by the CPU in those devices which require service by the active Controller. When a DOE or IDY frame is retransmitted or sourced by a device with SSRQ set, the SRQ bit in such a frame is set to one during the transmission but the values of the SRQ bits in registers R2W and R2R are not affected.

Bit RFCR (RFC Message Received) is set when an interface chip has detected the reception of the RFC message. Bit SLRD (Set Local Ready) is set only by the interface CPU and provides the chip with a simple means of handling the CMD-RFC handshake—it is set when the interface CPU has completed the processing of a command and is ready for another command. If an RFC command is received when SLRDY is not set, the RFC command will not be retransmitted until SLRDY is set. When SLRDY is set the RFC frame is transmitted. Similarly, if SLRDY is already set when RFC is received, RFC is automatically retransmitted. In both cases, RFCR is cleared automatically when the RFC is transmitted. If a command is received which does not affect that device, the CPU is not interrupted and therefore SLRDY is set by the chip.

When it is desired to initialize the chip status, the MCL (Master Clear) bit is set. This bit is set at device turn-on and can also be set by the CPU to clear the status of the chip and reset the registers to the status existing at instrument turn-on.

Register R1 is the interrupt register containing the interrupt bits IFCR (IFC Message Received), SRQR (SRQ Message Received), FRAV (Frame Available), FRNS (Frame Received Not As Set) and ORAV (Output Register Available). Each of these bits serves as an interrupt for the interface CPU. Each of these bits has an associated interrupt enable bit in R1W. The clearing of any of these enable bits will mask its associated interrupt bit thereby enabling the CPU to select which of the interrupts has high enough priority that it will respond to that interrupt. Because the IFC command is an important command which enables the System Controller to interrupt loop operation and retake control of the loop, this interrupt can only be cleared by the interface CPU by setting CLIFCR. CLIFCR is self-resetting—i.e., it will be automatically cleared two microseconds after it is set. The other interrupt bits can be reset by the interface chip in response to messages from other sources as well as in response to the CPU. For example, the SRQR is set in an active Controller (i.e., CA=1) when it receives a message indicating that a device on the loop requires service. However, if before the CPU responds to the SRQR interrupt a succeeding message arrives at the loop indicating that no device on the loop now requires service, then SRQR will be cleared in response to such a message without requiring action by the CPU.

A Frame is loaded into register R2R only when it needs to be acted on by the interface CPU. The CPU is informed that a frame is available for it to act on by setting either FRAV or FRNS. When a device interface sources a frame, it retains a copy of that frame in its output register R2W and in the first three bits of R1W. When that device next receives a frame it checks to see if that frame is equal to the frame which it sent. If it is not equal then it loads the received frame into R2R and sets FRNS to let the CPU act on this information. The primary purpose of this procedure is to enable a Talker to see if its Data messages are being passed error free around the loop and to enable the active Controller to see if its Command messages are being passed error free around the loop. However, there are a few other situations in which FRNS is set but which do not indicate that a transmission error has occurred. For example if an IDY frame is sent around the loop by the active Controller at a time when at least one device requires service, then such devices will alter a bit in the IDY message to indicate their need for service. In this case the setting of FRNS just lets the CPU process the returned IDY message to learn that at least one device requires service. In the cases in which a message is loaded into register R2R and no error has been detected, then FRAV is set instead of FRNS. Both FRAV and FRNS are reset when R2R is read.

Bit ORAV is set when a loop handshake is complete and the output register is available for sending the next frame. ORAV is also set in a few other cases that will be discussed below.

When MCL is set, the chip is initialized by setting bits and latches as follows: (1) interrupt bits IFCR, SRQR, FRNS and FRAV are cleared and interrupt bit ORAV is set; (2) the five interrupt bits are cleared so that no interrupts can occur until the CPU sets at least one of these bits high; (3) the SC bit is set to 1 if and only if the system user has selected that device as the System Controller (e.g., by means of a switch on the device console); (4) a Retransmit Service Request latch (which will be discussed below) is cleared; and (5) an ORE (Output Register) empty bit (which will also be discussed below) is set high.

The response of an interface chip to an input frame is dictated primarily by the status of the bits in registers R0 and R1. The status of these bits causes the chip to automatically decode most subsequent frames so that only those frames which affect a device are routed to the CPU, while other frames are automatically retransmitted.

Referring to FIG. 2, the bit decoder 36 (shown in FIG. 3) in detector 23 is coupled to a multiplexer 25 and an input pointer counter 27 to control transfer of data from detector 23 to an input buffer 26. In response to a sync bit, detector 23 applies a reset signal to buffer 26 and counter 27 to reset these two devices. At each successive bit in a frame, counter 27 is incremented by 1. Multiplexer 25 is controlled in response to counter 27 so that successive bits of a serial input frame are loaded successively into the 11 bits of input buffer 26. When the 11th bit (D1) of the input frame has been loaded into buffer 26, a signal IPT 11 is sent from counter 27 to an Acceptor PLA 216 to inform PLA 216 that loading of the frame into buffer 26 is complete.

The existence of input buffer 26 in addition to an input register 217 enables a second frame to be entered into the interface (i.e., into buffer 26) even before a first frame which is present in input register 217 has been completely processed. This could happen for example if an IDY or IFC is asynchronously sourced by the active Controller or System Controller, respectively, while another frame is on the loop.

When the frame in input register 217 has been processed, gates are opened which allow the contents of input buffer 26 to be copied into input register 217. If the previous frame has been processed before a new frame arrives (as is usually the case), the incoming frame is loaded into buffer 26 and register 217 simultaneously. Decoding of an incoming frame by IDY-CMD decoder 218 begins as soon as the three command bits have been entered into buffer 26. Further decoding by frame decoder 219 begins as soon as frames are being loaded into input register 217. Because only the first bit C3 of a DOE frame need be decoded to identify that type of frame, this type of frame is very quickly identified.

The determination of the frame type is communicated from decoders 218 and 219 to PLA 216 to enable the chip to respond to the input frame. Depending on the frame type and device status one of three responses will occur: (1) the frame is automatically retransmitted using multiplexer 221; (2) the frame is automatically retransmitted using multiplexer 220 and will also be loaded into the first 3 bits of register R1R and into the 8 bits of register R2R; or (3) the frame is loaded into registers R1R and R2R without retransmission.

In addition to the above 3 responses, if the interface has sourced a frame which has not previously returned, the interface will asume that the received frame is that frame and will error check the received frame. To enable sourced frames to be error checked, a copy of the previously sourced frame is retained in output register 210 (i.e., the first 3 bits of register R1W and the 8 bits of register R2W) until after the error check. To accomplish the error check, an output pointer counter 223 is incremented through an 11 bit range and its contents are simultaneously fed to multiplexers 220 and 221 to strobe corresponding data from these 2 multiplexers into each of the inputs of an exclusive-OR gate 222. If the two frames being compared are equal then the resulting bit stream from gate 222 will be all zeros. When the received frame is loaded into R1R/R2R for the CPU to read, either interrupt FRAV or interrupt FRNS is set to inform the CPU that there is a frame for it to read. If there has been no error checking or if an error check has found no error then FRAV is set. However, if an error check has detected an error then FRNS is set instead of FRAV.

The interface chip includes an address register 212 in which the address of the device is stored. The existence of the device addressed allows command frames to be coded so that only selected devices will respond to these command frames. This is accomplished by dedicating some of the bits in such command frames to indicate the address of the device that is to respond to the command. An address comparator 224 is connected to input register 217 and to address register 224 to enable the comparison of the command address with the device address.

A transmit encoder 225 is connected to an output multiplexer 226 to select between three alternative sources of frames for transmission by the chip. The first source is an RFC encoder 227 which is used by the active Controller to source an RFC frame when a previously sourced command frame has returned and been error checked. The second source is multiplexer 220 which is used for automatic retransmission of certain received frames. The third source is output register 210 into which a frame is written by the CPU after the CPU has processed it and is ready to retransmit it. The act of writing to register 210 triggers the transmission of the frame in that register.

As a frame is retransmitted the frame can be altered to indicate the need for service by that device. If Send Service Request (SSRQ) is true in register 28 and the frame being transmitted is a DOE or IDY frame the bit C1 can be set to 1 to indicate the need for service. If the frame is an IDY and the device has been configured for parallel polling, the IDY bit with which that device is associated is set to indicate the need for service.

The interface chip includes a parallel poll register 211 to control the response of a device for purposes of a parallel poll. The IDY frame is utilized to execute a parallel poll. The IDY message is sourced by the active Controller and can be sent to check for loop integrity and/or to see if any devices require service. In a parallel poll any of the 8 data bits can receive the service request so that up to 8 devices can respond uniquely although more than one device can respond on a single bit.

The active Controller, having sourced the IDY frame, error checks it upon return. ORAV is set to signal the completion of the handshake. If an "error" is detected because one of the IDY bits has been changed by a device on the loop to signal the need for service, FRNS is set and the frame is made available to the CPU by shifting it into register R1R/R2R. Since IDY also contains the C1 bit to signal need for service, this bit would also be set by any device needing service regardless of whether the device also has responded on one of the parallel poll bits.

Parallel poll register 211 is connected to the transmit encoder 225 to enable the SRQ and parallel poll bits to be set on the fly as a frame is transmitted. Register 211 regulates the response of the interface for purposes of parallel polls. The interface will respond to a parallel poll only if PPIST (Parallel Poll Individual Status) and PPEN (Parallel Poll Enable) are both set. If either of these bits is not set then the interface will not alter any of the IDY messages. PPIST is set and cleared by the CPU to indicate whether the device needs service and PPEN is set and cleared in response to commands from the active Controller to indicate whether the controller wants the device to take part in a parallel poll. The use of PPEN enables the active Controller to enable and disable devices from the parallel poll response so that for example several devices can be associated with a given IDY data bit but only one or a few of them are presently enabled to respond on the bit.

Bits P3, P2 and P1 represent the binary value of the IDY data bit on which this interface is to respond. PPSENSE (Parallel Poll Sense) controls the nature of the response. If the interface is set to respond on the n-th bit Dn of the IDY frame then the response is $Dn(out) = Dn(in) + (\overline{PPIST \oplus PPSENSE})PPEN$ where $\oplus$ represents exclusive-OR (namely, $\overline{A \oplus B} = 1$ if and only if $A = B$). The effect of this response scheme is that when PPSENSE is low, then if Dn is sent as a zero by the active Controller, it will return as a zero only if all of the devices enabled to respond on Dn require service. Similarly, when PPSENSE is high, then if Dn is sent as a zero by the active Controller, it will return as a 1 if any of the devices enabled to respond on Dn require service. The active Controller can mask the parallel poll response on any given data bit by transmitting that bit as a one. Since this bit will return as a 1 regardless of the status of the bits in parallel poll register 211, no information will be transferred on this bit.

The other two bits in the parallel poll register 211 are not involved in parallel poll. The ORE (Output Register Empty) bit is used to indicate when register R2W is empty to avoid writing a successive frame into that register before the transmission of a previous frame is complete. This bit is cleared when a frame is loaded into R2W and is set when all 11 bits have been transmitted. Bit RERR is only set high when a sync bit is received in the middle of a frame thereby indicating an error in the received frame.

The command frames are divided into five groups: UCG (Universal Command Group), TAG (Talker Address Group), LAG (Listener Address Group), SCG (Secondary Address Group) and ACG (Addressed Command Group). The bit pattern identifying these groups is shown in Table 2:

TABLE 2

|  | D8 | D7 | D6 | D5 | D4 | D3 | D2 | D1 |
|---|---|---|---|---|---|---|---|---|
| UCG | x | 0 | 0 | 1 | x | x | x | x |
| SCG | x | 1 | 1 | x | x | x | x | x |
| TAG | 0 | 1 | 0 | ADR4 | ADR3 | ADR2 | ADR1 | ADR0 |
| LAG | 0 | 0 | 1 | ADR | ADR3 | ADR2 | ADR1 | ADR0 |
| ACG | x | 0 | 0 | 0 | x | x | x | x |

(x's are "don't cares" for decoding and are used to encode different messages within each group)

The universal commands and secondary commands are those commands which are of interest to all devices and therefore they are always made available to the CPU by setting FRAV (or FRNS) and loading a received universal command into register R1R/R2R. The Talker address commands are used to set the selected Talker into the Talker active state. In this command, data bits D1-D5 contain the address of the device which is to become the Talker. Address comparator 224 compares these bits with bits D1-D5 in Address register 212. When the addresses match, that device is set into Talker active state by setting the TA bit. Since only one device on the loop is allowed to be Talker active at one time, all devices for which these addresses aren't equal, clear the TA bit.

In a similar manner, bits D1-D5 in the Listener address command contain the addresses of the device to be set into Listener active state. Since more than one device can be Listener active, the devices which do not correspond to this address do not respond in the manner analogous to that for Talker address commands (namely, by going inactive). Active Listeners are therefore only deactivated by a universal command which deactivates Listeners. The Addressed commands are only passed to the CPU of devices which are Listener and/or Talker active. Conversely, all command frames other than the IFC frame are made available to the CPU of devices with TA or LA set. The IFC is not made available to the CPU because it is decoded by the chip. Only those commands discussed above which are of interest to the device are made available to the CPU. When an IDY frame is received, it can be identified by decoder 218 after 2 bits have been received. An IDY frame is automatically retransmitted by all devices other than the active Controller.

When a command is received, decoder 218 can detect this after 3 bits have been received so that the atuomatic retransmission can begin after three bits have been loaded into buffer 26 or loading of the frame has begun into register 217, whichever of these events occurs last.

When a DOE frame is received, it can be identified after the first bit has been received. In devices which are not Talker or Listener active, the frame is promptly retransmitted—this avoids delaying passage around the loop by devices which are uninterested in data messages. In active Listeners, the DOE frame is made available to the CPU. In the active Talker, the DOE frame is error checked since the Talker is the source of data frames.

The Ready (RDY) frames are divided into two groups: the RFC frame and the other RDY frames. The RFC frame is issued automatically by the active Controller's chip when the previously issued command returns and error checks OK. Each device's chip decodes the RFC frame completely and, when its CPU indicates (via SLRDY) that the command has been understood, retransmits it.

The address ready group (ARG) frames are those RDY frames of interest to addressed devices (i.e., the active Talker, Controller and Listeners). In such active devices, the ARG frame is made available to the CPU. An ARG frame is retransmitted by writing it from the CPU to the output register R1W/R2W. The Address Ready Group includes the Start of Transmission (SOT) frames, the End of Transmission OK (ETO) frame, the End of Transmission with Error (ETE) frame and the Not Ready for Data (NRD) frame.

The SOT frames are used to initiate data transmission. After the Talker and Listeners have been designated via commands, the Controller sends the SOT frame. When the SOT frame is received by an active Talker or Listener, the SOT frame is made available to the CPU. When a Talker's CPU decodes the SOT frame, instead of retransmitting it, the Talker transmits its first DOE frame by writing it to R1W/R2W. Each DOE frame is automatically error checked upon return to the Talker. When the Talker is finished, it sources (via a write to R1W/R2W) the ETO frame if no errors were detected or ETE if errors were detected during the transfer of Data. Upon receiving the ETO or ETE frame, the Controller's chip sets FRAV allowing its CPU to determine when the Talker is done. Because the appropriate response to the occurrence of an error in transmission will vary depending on a number of factors, the choice of response is left open to the system user via appropriate programming.

The NRD frame permits a Controller to interrupt the transfer of Data. When such interrupting is desired by the Controller, the Controller will store the next Data frame it receives and replace it with an NRD frame. When the NRD frame is received by the Talker, it is made available to the Talker's CPU to inform the CPU that it is to discontinue sourcing Data. After retaining a copy of the frame present in its output register 210 (i.e., the previous Data frame it transmitted), the Talker retransmits the NRD (via a write to R1W/R2W) to pass the NRD back to the Controller. Upon receiving the NRD the Controller transmits the Data frame that it stored to enable Listeners between the Controller and Talker to receive it. Upon receiving this Data frame the Talker performs its usual error check. However, since that last frame transmitted by the Talker was the NRD, the Talker will detect an error and set both FRNS and ORAV. The CPU responds to these signals by checking the received data frame with the copy which it saved before transmission of the NRD.

The device address stored in address register 212 can be set in a number of ways. In one approach the address can be set at manufacture as a permanent address. This has the disadvantage of limiting an interface loop to no redundancy of device type. In a second approach the address can be set in response to user input such as signals from switches on the device console. In a third approach, device addresses can be set by means of an auto addressing scheme. In this scheme the active Controller sets its own address to 0 and then sources an Auto Address message. This message has 5 bits which contain the address 1 upon transmission by the Controller. At each device other than the Controller, the device makes the message available to its CPU. The CPU sets the address in register 212 equal to the address in this message, and then increases the address in the message before retransmitting the message to the next device in the loop.

Each interface includes a number of additional features which enhance loop performance. In response to a Power Down command, the interface can turn off all device and chip activity other than that of an edge detector. This enables a Controller to turn off virtually all loop activity to conserve energy. This is particularly useful in battery operated devices. The edge detector enables all devices to be powered up in response to any signal transmitted around the loop. The interface also contains a Retransmit All input which turns the interface into a simple repeater when this line is pulled high. In this state, all frames are automatically retransmitted without any other action by the device. This capability enables a device to be effectively removed from the loop (e.g., when the device is malfunctioning), without physically breaking the loop to remove the device. This avoids the inconvenience of having to reconfigure the loop and also avoids possibly disturbing ongoing loop operation. The Retransmit All state can be set in response to Controller commands or user signals (e.g., from a switch on the console of the device being placed into this state) but since it then will not respond to commands it cannot be taken out of this state by Controller commands.

The interface also includes a few features which make it friendly for system users. The identity of the device (e.g., Manufacturer and model number) can be stored in CPU or in a dedicated register. Likewise the capability of a device (e.g., whether it's a printer, plotter, etc.) can be stored in the CPU or in a dedicated register. Typically, the capability and identity will be stored as 8 bits of data which can be transferred as the data bits of a Data frame. This scheme therefore allows $2^8$ different identities and capabilities to be coded. Typically, a range of codes will be assigned to a particular class of devices (e.g., plotters) so that each class can be divided into as many subclasses as there are codes in its associated range of codes.

These capabilities not only let the user request such information from loop devices, it also enables the use of friendly programming commands. For example if the user desires to plot data measured by a voltmeter, the user need not know the printer or voltmeter in the loop. Instead, the user can simply command that the data being measured say by the Model HP-3468A voltmeter be printed on the Model HP-82162A printer. The Controller will then sequentially poll the devices around the loop as to their identity and/or their capability until it locates the selected devices. The Controller then notes the addresses of these devices and uses them to set the voltmeter into Talker active state and the printer into Listener active state.

The serial poll is executed as follows. Beginning at a selected point in the loop (which by default can be chosen as the device at address 1) the Controller sets that device into Talker active state and then sends it a Ready message which tells it the type of data to send and that it is to start sending now. These Ready frames are analogous to the Start of Transmission frames which initiate Data transfer. Two examples of these Ready frames are the Send Identity and Send Capability frames which initiate the transfer of the device identity and capability respectively. When a Send Identity frame is received by the device whose identity is being requested, that device replaces that frame with a Data frame containing its identity. When this frame reaches the Controller it passes the frame to its CPU for response. The CPU then loads this frame into the output register to retransmit it back to the Talker (i.e., the device whose identity was requested). The Talker error checks the frame and sends an ETO or ETE frame to the Controller to complete the handshake. An analogous series of steps occur for a Send Capability Ready frame.

In a similar manner, control can be passed from the active Controller to another Controller in the Loop. The active Controller first sends a Talk Address command to set the other Controller into Talker active state and then sends a Take Control ready frame. Upon sourcing the Take Control ready frame, the active Controller clears its CA bit. Upon reception of this frame the other Controller sets its CA bit and takes over control of the loop.

We claim:

1. A process of transferring message frames of at least a first type and a second type in a linear interface of the type in which at least one receiver is connected to a source in a linear configuration, in which the source has an output port connected to an input port of a first receiver, in which any other receivers each has an input port connected to an output port of a preceeding receiver in the configuration so that message frames pass from the source along the linear interface to a last receiver, said process comprising the steps of:
   transmitting a message frame from the source to the first receiver;
   each receiver other than the last one passing the message frame on to its succeeding receiver in the linear configuration;
   when the first receiver is ready to accept another message frame, transmitting a Ready signal in the direction from the first receiver toward the last receiver;
   at each receiver other than the first and last ones, when that receiver is ready to accept another message frame and has also received a Ready signal from the preceding receiver in the linear configuration, transmitting a Ready signal to its succeeding receiver in the linear configuration; and
   controlling the source to transmit a succeeding message frame only if the last receiver has received a Ready signal and is ready itself to receive another message frame, thereby transmitting said succeeding message frame only when all receivers are ready to accept another message frame.

2. A process as in claim 1 wherein the message frames include a first type which is typically of interest only to a small number of receivers, said process further comprising the steps of:
   testing the message frame upon reception by each receiver to determine whether it is of the first type; and
   if it is, then performing the step of passing it on only when said receiver is ready to accept another message frame whereby the first type of message frame itself is the Ready signal for each receiver.

3. A process as in claim 2 wherein at least one receiver can assume a listener active state or a listener inactive state, wherein receivers in the listener active state respond to each message frame of the first type before performing the step of passing it on and wherein receivers in the listener inactive state promptly perform the step of passing the message frame on upon reception without responding to it.

4. A process as recited in claim 1 wherein the types of message frames include a second type which is typically of interest to a greater number of receivers than the first type of message frame, said process further comprising the steps of:
   testing the message frame upon reception by each receiver to determine whether the message frame is of the second type; and
   if it is, then saving a copy of the message frame and promptly performing the step of passing it on.

5. A process as in claim 4 further comprising, after the step of tranmitting a second type of message frame from the source, the step of transmitting a Ready signal from the source to the first receiver, said first receiver transmitting a Ready signal only when it is ready for another message frame and has received the Ready signal transmitted by the source.

6. A process as recited in claim 1 wherein said message frames and receivers can be assigned addresses, said process further comprising the step of:
   each receiver comparing the address of a message frame to its own address; and
   responding to the message frame only if there is a match between these addresses.

7. A process as in claim 6 wherein addresses are assigned to the receivers by the steps of:
   transmitting an Auto Address message frame from the source, said Auto Address message frame containing an address and each receiver other than the last:
   upon reception of the Auto Address message frame and in response to the address in said Auto Address message frame, assigning to said receiver an address to which it will respond;
   incrementing the address in the Auto Address message frame;
   transmitting the incremented Auto Address message frame to the succeding receiver in the configuration; and
   upon reception of the incremented Auto Address message frame by the last receiver and in response to the address in said Auto Address message frame assigning to the last receiver an address to which it will respond.

8. A process as in claim 6 wherein the message frames include a universal type of message frame to which all receivers respond regardless of the address or state of each receiver.

9. A process as in claim 8 wherein each receiver can assume a listener active state or a listener inactive state, wherein receivers in the listener active state respond to each mdssage frame of the first type before performing the step of retransmitting it and wherein receivers in the listener inactive state promptly perform the step of retransmitting each message frame of the first type upon reception without responding to it, said process further comprising the steps of:

passing from the source to all of the receivers an Unlisten universal message frame to which each receiver responds by entering the listener inactive state;

passing from the source to all of the receivers at least one Listen addressed message frame to which only those receivers having their address matching the address of at least one of these message frames respond by entering the listener active state.

10. A process as in claim 6 wherein at least one receiver can assume a talker active state or a talker inactive state wherein receivers in a talker inactive state do not function as a source for message frames and a receiver in the talker active state can function as a source of message frames, said process further comprising the steps of:

passing from the source to all of the receivers a Talk addressed message frame to which only the receiver whose address matches the address of this message frame responds by entering the talker active state;

transmitting from the source a Start of Transmission message frame to inform the receiver which has just entered the talker active state that it is to take over as the source of message frames, the source also entering the talker inactive state;

each receiver which receives the Start of Transmission message frame and is in a talker inactive state, retransmitting the Start of Transmission message frame to pass the Start of Transmission message frame to its succeeding receiver in the configuration;

the receiver which is in the talker active state, responding to the Start of Transmission message frame by taking over the role as the sorce of message frames.

11. A process as in claim 10 wherein at least one receiver can assume a controller active state or a controller inactive state, wherein receivers in a controller inactive state do not function as a source of command message frames and wherein a receiver in the talker active state can function as a source of command message frames, said process further comprising the steps of:

passing from the source to all of the receivers a Talk addressed message frame to which only the receiver whose address matches the address of this message frame responds by entering a talker active state;

transmitting from the source a Take Control ready message frame to inform the receiver which has just entered the talker active state that it is to enter the controller active state and take over as the source of message frames;

each receiver which recdives the Take Control ready message frame and is in a talker inactive state, retransmitting the Take Control ready message frame to pass it to its succeeding receiver in the configuration;

the receiver which is in the talker active state, responding to the Take Control ready message frame by entering the controller active state and taking over as the source of message frames.

12. A process as in claim 11 wherein a different receiver is in the controller active state than is in the talker active state and in which the talker active receiver is functioning as the source of message frames, said process further comprising the steps of:

after transmission of all of the data message frames to be transmitted by the talker active receiver, transmitting an End of Transmission message frame from the talker active receiver to inform the controller active receiver that data transmission has been completed and the controller active receiver is to resume the function as the source of message frames;

each receiver other than the controller, retransmitting the End of Transmission message frame to pass it on to the controller active receiver; and the controller active receiver in response to the End of Transmission message frame, resuming the function as the source of message frames.

13. A process as in claim 11 wherein a different receiver is in the controller active state than is in the talker active state and in which the talker active receiver is functioning as the source of message frames, said process further comprising the steps of:

when the controller active receiver wants to take back the function of being the source of message frames, then upon receipt of the next message frame from the talker active receiver, temporarily saving that message frame and in its place transmitting a Not Ready For Data message frame;

passing the Not Ready For Data message frame to the talker active receiver to inform it that it is to cease initiating message frames;

passing the Not Ready For Data message frame from the talker active receiver on to the controller active receiver;

passing from the controller active receiver to the talker active receiver the message frame which was temporarily saved;

transmitting from the talker active receiver an End of Transmission message frame and passing it along the configuration to the controller active receiver to inform the controller active receiver that it is to assume the function of initiating message frames; and in response to the End of Transmission message frame, the controller active receiver assuming the function of being the source of message frames.

14. A process as in claim 1 further comprising the steps of:

at system configuration, setting one of the devices in the configuration into a system controller state in which, even when it is not functioning as the source of message frames, it can initiate a special message frame called an Interface Clear message frame to retake control of the interface;

when the system controller active device is not the source of message frames and wants to retake control of the interface, transmitting an Interface Clear message frame;

each receiver other than the system controller, assuming an inactive state in which it will not function as the source of message frames and then passing the Interface Clear message frame on to its succeeding receiver in the interface so that it can pass around the interface to the system controller; and upon reception of the Interface Clear message frame by the system controller, setting that device into an active state in which it serves as the source of message frames.

15. A process of transferring message frames of at least a first type and a second type in a loop interface of the type in which a plurality of receivers are connected to a source in a loop configuration, in which the source and all of the receivers each have an input port connected to an output port of a preceding device in the loop so that message frames transmitted by the source are passed around the loop to the source, said process comprising the steps of:
  transmitting a message frame from the source;
  each receiver passing the message frame on to its succeeding device in the loop;
  transmitting from the source a Ready signal;
  at each receiver, when that receiver is ready to accept another message frame and has also received a Ready signal from the preceding receiver in the linear configuration, transmitting a Ready signal to its succeeding device in the linear configuration; and
  controlling the source to transmit a succeeding message frame only after it receives the Ready signal, thereby transmitting succeeding message frames only when all of the receivers on the loop are ready to receive another message frame.

16. A process as in claim 15 wherein the message frames include a first type which is typically of interest only to a small number of receivers, said process further comprising the steps of:
  testing the message frame upon reception by each receiver to determine whether it is of the first type; and
  if it is, then performing the step of passing it on only when said receiver is ready to accept another message frame whereby the first type of message frame itself is the Ready signal for each receiver.

17. A process as in claim 15 wherein at least one receiver can assume a listener active state or a listener inactive state, wherein receivers in the listener active state respond to each message frame of the first type before performing the step of passing it on and wherein receivers in the listener inactive state promptly perform the step of passing the message frame on upon reception without responding to it.

18. A process as recited in claim 15 wherein the types of message frames include a second type which is typically of interest to a greater number of receivers than the first type of message frame, said process further comprising the steps of:
  testing the message frame upon reception by each receiver to determine whether the message frame is of the second type; and
  if it is, then saving a copy of the message frame and promptly performing the step of passing it on.

19. A process as in claim 18 wherein, when the message frame transmitted by the source is of the second type, then the Ready signal is transmitted by the source only after receiving the message frame back at the source.

20. A process as recited in claim 15 wherein said message frames and receivers are assigned addresses, said process further comprising the step of:
  each receiver comparing the address of a message frame to its own address; and
  responding to the message frame only if there is a match between these addresses.

21. A process as in claim 20 wherein addresses are assigned to the receivers by the steps of:
  transmitting an Auto Address message frame from the source, said Auto Address message frame containing an address and each receiver:
    upon reception of the Auto Address message frame and in response to the address in said Auto Address message frame, assigning to said receiver an address to which it will respond;
    incrementing the address in the Auto Address message frame; and
  transmitting the incremented Auto Address message frame to the succeeding device in the loop.

22. A process as in claim 20 wherein the message frames include a universal type of message frame to which all receivers respond regardless of the address or state of each receiver.

23. A process as in claim 22 wherein each receiver can assume a listener active state or a listener inactive state, wherein receivers in the listener active state respond to each message frame of the first type before performing the step of retransmitting it and wherein receivers in the listener inactive state promptly perform the step of retransmitting each message frame of the first type upon reception without responding to it, said process further comprising the steps of:
  passing from the source to all of the receivers an Unlisten universal message frame to which each receiver responds by entering the listener inactive state;
  passing from the source to all of the receivers at least one Listen addressed message frame to which only those receivers having their address matching the address of at least one of these message frames respond by entering the listener active state.

24. A process as in claim 20 wherein at least one receiver can assume a talker active state or a talker inactive state, wherein receivers in a talker inactive state do not function as a source for message frames and wherein a receiver in the talker active state can function as a source of message frames, said process further comprising the steps of:
  passing from the source to all of the receivers a Talk addressed message frame to which only the receiver whose address matches the address of this message frame responds by entering the talker active state;
  transmitting from the source a Start of Transmission message frame to inform the receiver which has just entered the talker active state that it is to take over as the source of message frames, the source also entering the talker inactive state;
  each receiver which receives the Start of Transmission message frame and is in a talker inactive state, retransmitting the Start of Transmission message frame to pass the Start of Transmission message frame to its succeeding receiver in the configuration;
  the receiver which is in the talker active state, responding to the Start of Transmission message frame by taking over the role as the source of message frames.

25. A process as in claim 24 wherein at least one receiver can assume a controller active state or a controller inactive state, wherein receivers in a controller inactive state do not function as a source of command message frames and wherein a receiver in the talker active state can function as a source of command message frames, said process further comprising the steps of:

passing from the source to all of the receivers a Talk addressed message frame to which only the receiver whose address matches the address of this message frame responds by entering a talker active state;

transmitting from the source a Take Control ready message frame to inform the receiver which has just entered the talker active state that it is to enter the controller active state and take over as the source of message frames;

each receiver which receives the Take Control ready message frame and is in a talker inactive state, retransmitting the Take Control ready message frame to pass it to its succeeding device in the configuration;

the receiver which is in the talker active state, responding to the Take Control ready message frame by entering the controller active state and taking over as the source of message frames.

26. A process as in claim 25 wherein a different receiver is in the controller active state than is in the talker active state and in which the talker active receiver is functioning as the source of message frames, said process further comprising the steps of:

after transmission of all of the data message frames to be transmitted by the talker active receiver, transmitting an End of Transmission message frame from the talker active receiver to inform the controller active receiver that data transmission has been completed and the controller active receiver is to resume the function as the source of message frames;

each receiver other than the controller, retransmitting the End of Transmission message frame to pass it on to the controller active receiver; and the controller active receiver in response to the End of Transmission message frame, resuming the function as the source of message frames.

27. A process as in claim 25 wherein a different receiver is in the controller active state than is in the talker active state and in which the talker active receiver is functioning as the source of message frames, said process further comprising the steps of:

when the controller active receiver wants to take back the function of being the source of message frames, then upon receipt of the next message frame from the talker active receiver, temporarily saving that message frame and in its place transmitting a Not Ready For Data message frame;

passing the Not Ready For Data message frame to the talker active receiver to inform it that it is to cease initiating message frames;

passing the Not Ready For Data message frame from the talker active receiver on to the controller active receiver;

passing from the controller active receiver to the talker active receiver the message frame which was temporarily saved;

transmitting from the talker active receiver an End of Transmission message frame and passing it around the loop to the controller active receiver to inform the controller active receiver that it is to assume the function of initiating message frames; and in response to the End of Transmission message frame, the controller active receiver assuming the function of being the source of message frames.

28. A process as in claim 15 further comprising the steps of:

at system configuration, setting one of the devices in the configuration into a system controller state in which, even when it is not functioning as the source of message frames, it can initiate a special message frame called an Interface Clear message frame to retake control of the loop;

when the system controller active device is not the source of message frames and wants to retake control of the loop, transmitting an Interface Clear message frame;

each receiver other than the system controller, assuming an inactive state in which it will not function as the source of message frames and then passing the Interface Clear message frame on to its succeeding receiver in the loop so that it can pass around the loop to the system controller; and upon reception of the Interface Clear message frame by the system controller, setting that device into an active state in which it serves as the source of message frames.

29. A process as recited in claim 15 wherein the message frame in an Identify message frame which requires no response by any of the devices other than retransmission to the next receiver in the loop, said process further comprising the step of:

testing the message frame upon reception by each receiver to determine if it is the Identify message frame and if it is then immediately performing the step of retransmitting it thereby enabling the source to rapidly determine whether the loop is intact by rapidly passing the Identify message frame around the loop.

30. A process as in claim 29 wherein the Identify message frame has a set of parallel poll bits each of which can be set to its complementary value without changing the status of the message frame as an Identify message frame, said process further comprising the steps of:

before transmitting the Identify message frame from the source, assigning each receiver in a set of selected receivers to an associated one of said parallel poll bits;

upon reception of the Identify message frame by any receiver which has been assigned to a bit and also requires servicing, setting its associated bit to the value which is complementary to the initial value at the time of transmission by the source; and upon reception of the Identify message frame by the source, determining which parallel poll bits have been altered whereby the source determines if any device servicing is requested and in addition determines that the devices requiring service are within the set of devices associated with those bits which have been altered.

31. A process as in claim 15 further comprising the steps of:

keeping in the source a temporary copy of a message frame transmitted by the source; and upon receipt of the message frame by the source, comparing with this copy the next message frame received by the source and if this next message frame is not identical to the copy, then producing an error indication.

32. A process as recited in claim 15 wherein one of the receivers is in a controller active state in which it is responsible for controlling the operation of the loop and wherein a service request bit in a message frame can be altered by a receiver requiring service to signal the controller active device that it requires service, said process further comprising the steps of:

in any receiver needing service, before retransmitting a message frame to pass it on, altering the service request bit; and checking the service request bit by the controller active receiver to see if any other receivers require service.

33. A process as in claim 15 wherein the message frames are transmitted in a bit serial format in which each message frame comprises a consecutive sequence of bits the first of which is a specially coded sync bit which indicates the start of a message frame.

* * * * *